(12) United States Patent
Ma et al.

(10) Patent No.: US 10,192,847 B2
(45) Date of Patent: Jan. 29, 2019

(54) RAPID COOLING SYSTEM FOR A BOND HEAD HEATER

(71) Applicants: Lu Ma, Kwai Chung (HK); Cheuk Wah Tang, Kwai Chung (HK); Pak Kin Leung, Kwai Chung (HK)

(72) Inventors: Lu Ma, Kwai Chung (HK); Cheuk Wah Tang, Kwai Chung (HK); Pak Kin Leung, Kwai Chung (HK)

(73) Assignee: ASM TECHNOLOGY SINGAPORE PTE LTD, Singapore (SG)

( * ) Notice: Subject to any disclaimer, the term of this patent is extended or adjusted under 35 U.S.C. 154(b) by 864 days.

(21) Appl. No.: 14/302,699

(22) Filed: Jun. 12, 2014

(65) Prior Publication Data

US 2015/0364440 A1 Dec. 17, 2015

(51) Int. Cl.
*H01L 23/00* (2006.01)

(52) U.S. Cl.
CPC .... *H01L 24/75* (2013.01); *H01L 2224/75502* (2013.01)

(58) Field of Classification Search
CPC .............. H01L 24/75; H01L 2224/75502
USPC .............. 228/6.2, 179.1, 44.3, 44.7, 4.1; 156/583.1; 165/61
See application file for complete search history.

(56) References Cited

U.S. PATENT DOCUMENTS

| | | | | |
|---|---|---|---|---|
| 4,667,870 A * | 5/1987 | Avedissian | ......... | H01L 21/6838 228/1.1 |
| 4,783,721 A * | 11/1988 | Yamamoto | ............ | G02F 1/0036 257/714 |
| 7,886,802 B2 * | 2/2011 | Martino | ............... | G11B 25/043 156/272.2 |
| 9,057,567 B2 * | 6/2015 | Lyon | .................... | F28D 15/00 |
| 9,553,069 B2 * | 1/2017 | Han | ...................... | H01L 24/75 |
| 9,576,928 B2 * | 2/2017 | Wasserman | ............. | H01L 24/75 |
| 2002/0003137 A1 * | 1/2002 | Yokoyama | ........... | B23K 3/0471 219/243 |
| 2004/0206477 A1 * | 10/2004 | Kenny | .................. | F04B 17/00 165/80.4 |
| 2006/0169405 A1 * | 8/2006 | Smith | .................... | B32B 37/06 156/308.2 |
| 2006/0289987 A1 * | 12/2006 | Chiu | .................... | H01L 23/473 257/714 |
| 2007/0023275 A1 * | 2/2007 | Tanase | ................ | C23C 14/3407 204/192.1 |
| 2007/0093079 A1 * | 4/2007 | Aruga | .................... | B82Y 10/00 438/800 |
| 2008/0197172 A1 * | 8/2008 | Reiber | ................... | B23K 20/10 228/180.5 |
| 2008/0210383 A1 * | 9/2008 | Hirata | .............. | H01L 21/67092 156/498 |

(Continued)

FOREIGN PATENT DOCUMENTS

WO    WO 2013/101212 A1    7/2013

*Primary Examiner* — Claire Rojohn, III
(74) *Attorney, Agent, or Firm* — Ostrolenk Faber LLP

(57) ABSTRACT

A bond head comprises an insulation block, a heater plate attached to the insulation block and a collet located on the heater plate for holding a semiconductor device. The heater plate is operative to heat the semiconductor device that is held by the collet. A flow generation plate that is detachably mounted between the insulation block and the heater plate is configured to direct cooling gas from the insulation block onto the heater plate so as to rapidly cool the heater plate.

18 Claims, 3 Drawing Sheets

(56) References Cited

U.S. PATENT DOCUMENTS

| | | | | |
|---|---|---|---|---|
| 2008/0245472 A1* | 10/2008 | Hirata | B32B 38/1833 | 156/264 |
| 2010/0067123 A1* | 3/2010 | Hayata | G02B 7/008 | 359/738 |
| 2010/0140326 A1* | 6/2010 | Ebihara | B23K 20/106 | 228/111.5 |
| 2010/0219229 A1* | 9/2010 | Fujita | H01L 24/75 | 228/110.1 |
| 2010/0245479 A1* | 9/2010 | Forrest | B41J 2/005 | 347/47 |
| 2010/0247766 A1* | 9/2010 | Forrest | B41J 2/005 | 427/255.23 |
| 2011/0085299 A1* | 4/2011 | Mizunaga | H01L 21/67103 | 361/692 |
| 2011/0114708 A1* | 5/2011 | Maeda | B22F 1/0062 | 228/248.1 |
| 2011/0304987 A1* | 12/2011 | Oprins | H01L 23/4735 | 361/699 |
| 2012/0088362 A1* | 4/2012 | Hwang | H01L 24/16 | 438/615 |
| 2012/0091186 A1* | 4/2012 | Akiyama | H01L 21/67092 | 228/44.3 |
| 2012/0247664 A1* | 10/2012 | Kobayashi | H01L 24/75 | 156/285 |
| 2013/0122394 A1* | 5/2013 | Shintani | H01M 4/88 | 429/481 |
| 2013/0181037 A1* | 7/2013 | Nagai | H01L 24/75 | 228/103 |
| 2013/0240115 A1* | 9/2013 | Horng | H01L 24/75 | 156/64 |
| 2013/0292455 A1* | 11/2013 | Brofman | B23K 31/02 | 228/219 |
| 2013/0299133 A1* | 11/2013 | Li | F25B 21/02 | 165/80.3 |
| 2014/0027068 A1* | 1/2014 | Hung | H01L 24/75 | 156/583.1 |
| 2014/0140006 A1* | 5/2014 | Kuhlmann | H01L 23/4735 | 361/700 |
| 2014/0202636 A1* | 7/2014 | Mayr | B29C 66/9121 | 156/378 |
| 2015/0016083 A1* | 1/2015 | Nootens | H01C 17/00 | 361/820 |
| 2015/0129135 A1* | 5/2015 | Lee | H01L 24/75 | 156/378 |
| 2015/0146380 A1* | 5/2015 | Lu | H05K 7/1432 | 361/709 |
| 2015/0155210 A1* | 6/2015 | Lee | H01L 24/75 | 438/15 |
| 2015/0171047 A1* | 6/2015 | Malatkar | H01L 24/75 | 156/583.1 |
| 2015/0173209 A1* | 6/2015 | Dhavaleswarapu | B23K 3/085 | 228/194 |
| 2015/0364440 A1* | 12/2015 | Ma | H01L 24/75 | 165/61 |

* cited by examiner

RAPID COOLING SYSTEM FOR A BOND HEAD HEATER

FIELD OF THE INVENTION

The invention relates to heated bond heads for use in bonding semiconductor devices, and in particular to a cooling system for adjusting the temperatures of such heated bond heads.

BACKGROUND AND PRIOR ART

In certain chip bonding applications, a semiconductor device may need to be heated to a predetermined temperature in order to create conditions for bonding. For example, interconnects of a semiconductor device may have to be heated to their melting points to enable bonding of the semiconductor device to a substrate via such interconnects. In particular, bond heads incorporating pulse heating elements are popularly used in flip chip applications. Such pulse heating elements are capable of rapidly heating the bond head and thus the semiconductor device to reduce bonding cycle time. Thereafter, the semiconductor device should be cooled to hasten solidification of the interconnects to fix the semiconductor device onto the substrate.

Patent publication number WO 2013/101212 entitled "Direct Air Impingement Cooling of Package Structures" discloses a heater for heating a bond head which is cooled by direct air impingement. Various embodiments of microelectronics packing cooling assemblies are described, including a cooling assembly comprising an array of vertically separated micro channels coupled to a heat spreader, wherein the heat spreader is finless and each inlet micro channel has two adjacent outlet micro channels.

Generally, after heating of a bond head is performed by a heater plate, the air flow streaming through flow channels in an insulation block is used to cool the heater plate. The flow channels usually include some small holes in the insulation block. The insulation block is made from material that has low thermal conductivity and low coefficient of thermal expansion. The aim is to generate a high flow speed and thus a high cooling rate for the heater plate.

However, the designer typically has to place priority on material properties of the insulation block, such as having a low thermal conductivity and coefficient of thermal expansion, and may need to compromise heating capacity and fabrication freedom due to the limited choice of fabrication material. Accordingly, the flow speed and flow pattern are limited during the mechanical fabrication of the insulation block. As a result, it is difficult to further optimize the cooling rate due to the restricted heating capacity and fabrication capability in the manufacture of the insulation block.

SUMMARY OF THE INVENTION

It is thus an object of the invention to seek to provide a cooling system for heaters of bond heads which is adapted to promote faster cooling and which places less reliance on the material properties of components of the bond head as compared to the prior art.

According to a first aspect of the invention, there is provided a bond head, comprising: an insulation block; a heater plate attached to the insulation block and a collet located on the heater plate for holding a semiconductor device, the heater plate being operative to heat the semiconductor device that is held by the collet; a flow generation plate that is detachably mounted between the insulation block and the heater plate which is configured to direct cooling gas from the insulation block onto the heater plate so as to rapidly cool the heater plate.

According to a second aspect of the invention, there is provided a flow generation plate for a bond head comprising an insulation block, a heater plate attached to the insulation block and a collet located on the heater plate for holding a semiconductor device, the heater plate being operative to heat the semiconductor device that is held by the collet, wherein: the flow generation plate is detachably mountable between the insulation block and the heater plate and is configured to direct cooling gas from the insulation block onto the heater plate so as to rapidly cool the heater plate.

It will be convenient to hereinafter describe the invention in greater detail by reference to the accompanying drawings. The particularity of the drawings and the related description is not to be understood as superseding the generality of the broad identification of the invention as defined by the claims.

BRIEF DESCRIPTION OF THE DRAWINGS

Examples of a rapid cooling system in accordance with the invention will now be described with reference to the accompanying drawings, in which.

DETAILED DESCRIPTION OF THE PREFERRED EMBODIMENT OF THE INVENTION

Figure 1:
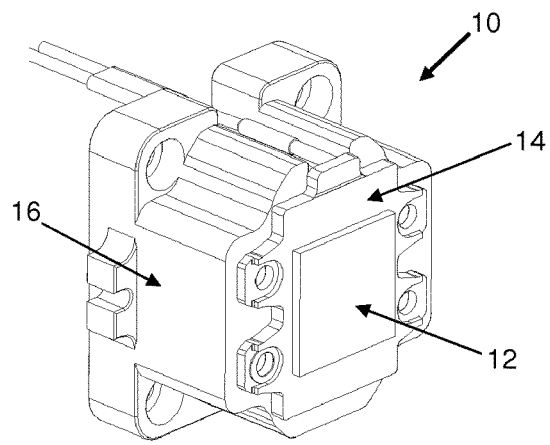
FIG. 1 is an isometric view of a bond head according to the preferred embodiment of the invention.

FIG. 1 is an isometric view of a bond head 10 according to the preferred embodiment of the invention. The bond head 10 comprises a collet 12 which is adapted to pick up a semiconductor device (not shown) via vacuum suction, and to bond the semiconductor device to a bonding surface of a substrate. The collet 12 is located on a heater plate 14 which is operative to heat up the collet 12, and thus a semiconductor chip that it is holding, to a bonding temperature. The heater plate 14 is in turn attached to an insulation block 16. The heater plate 14 may comprise a pulse heating element operatively connected to it, which is capable of rapidly heating the semiconductor chip to the bonding temperature.

Figure 2:
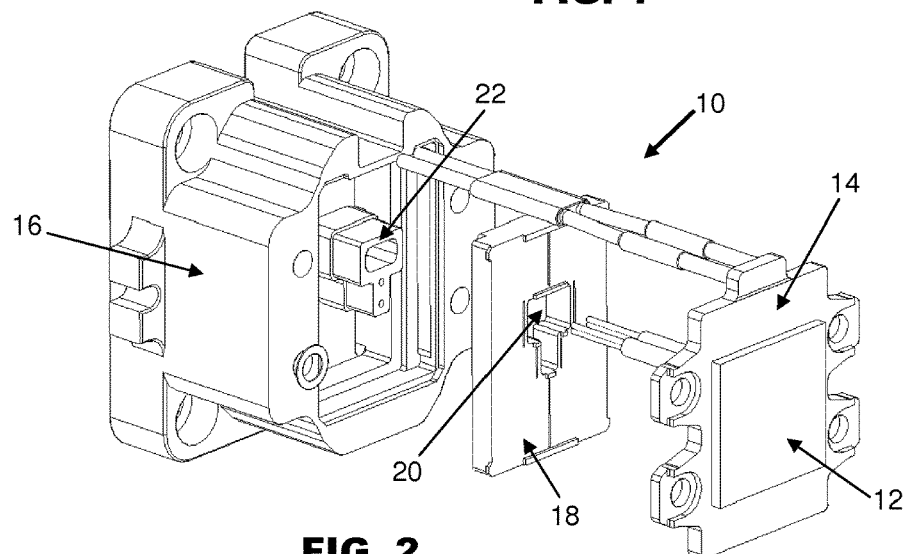
FIG. 2 is an exploded view of the bond head of FIG. 1 illustrating its internal structure.

FIG. 2 is an exploded view of the bond head 10 of FIG. 1 illustrating its internal structure. It further shows a separate flow generation plate 18 that is located between the heater plate 14 and the insulation block 16 and is detachably mounted therewith. The flow generation plate 18 may include a through-hole 20 located substantially centrally in the flow generation plate 18 which allows the insertion of a protrusion 22 extending from the insulation block 16, which facilitates the connection of electrical cables or other devices from the insulation block 16 to the heater plate 14. When the heater plate 14 is attached to the insulation block 16 as illustrated in FIG. 1, the flow generation plate 18 is clamped between the heater plate 14 and a recess in the insulation block 16 next to the protrusion 22.

Figure 3A:
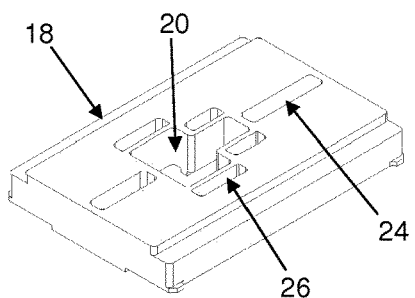
FIGS. 3A and 3B are isometric views of respective back and front sides of a flow generation plate comprised in the bond head.
Figure 3B:
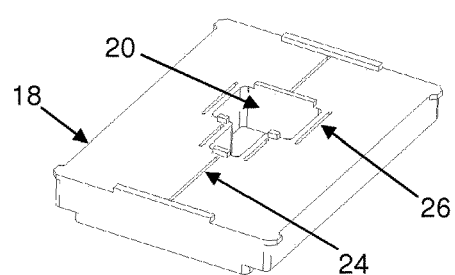

FIGS. 3A and 3B are isometric views of respective back and front sides of a flow generation plate 18 comprised in the bond head. FIG. 3A is an isometric view of a back side of the flow generation plate 18 that is facing the insulation block 16. There are a number of slots that have been machined into the flow generation plate 18 prior to mounting the flow generation plate 18. The slots are configured to direct cooling gas from the insulation block 16 onto the heater plate 14 so as to rapidly cool the heater plate 14. There may, for instance, be a longitudinal flow slot 24 extending centrally along a majority of a length of the flow generation plate 18 and peripheral flow slots 26 that extend parallel to the longitudinal flow slot 24 alongside opposite edges of the through-hole 20. The longitudinal flow slot 24 and peripheral flow slots 26 on the back side of the flow generation plate 18 may be formed as wider cutouts as compared to the front side of the flow generator plate 18. Alternatively, a gas chamber may be formed behind the back side of the flow generation plate 18 for introducing a gas flow into the respective flow slots 24, 26.

FIG. 3B is an isometric view of a front side of the flow generation plate 18 that is facing the heater plate 14. The flow slots 24, 26 that are found on this front side of the flow generation plate 18 are preferably slimmer and narrower as compared to the slots on the back side as shown in FIG. 3A. Correspondingly, there is a narrower longitudinal flow slot 24 extending centrally down the length of the flow generation plate 18, as well as narrower peripheral flow slots 26 that extend parallel to the longitudinal flow slot 24 alongside opposite edges of the through-hole 20.

However, it should be appreciated that other arrangements of the flow slots are possible so long as an adequate gas flow is generated onto the heater plate 14 in order to rapidly cool the heater plate 14.

Figure 4:
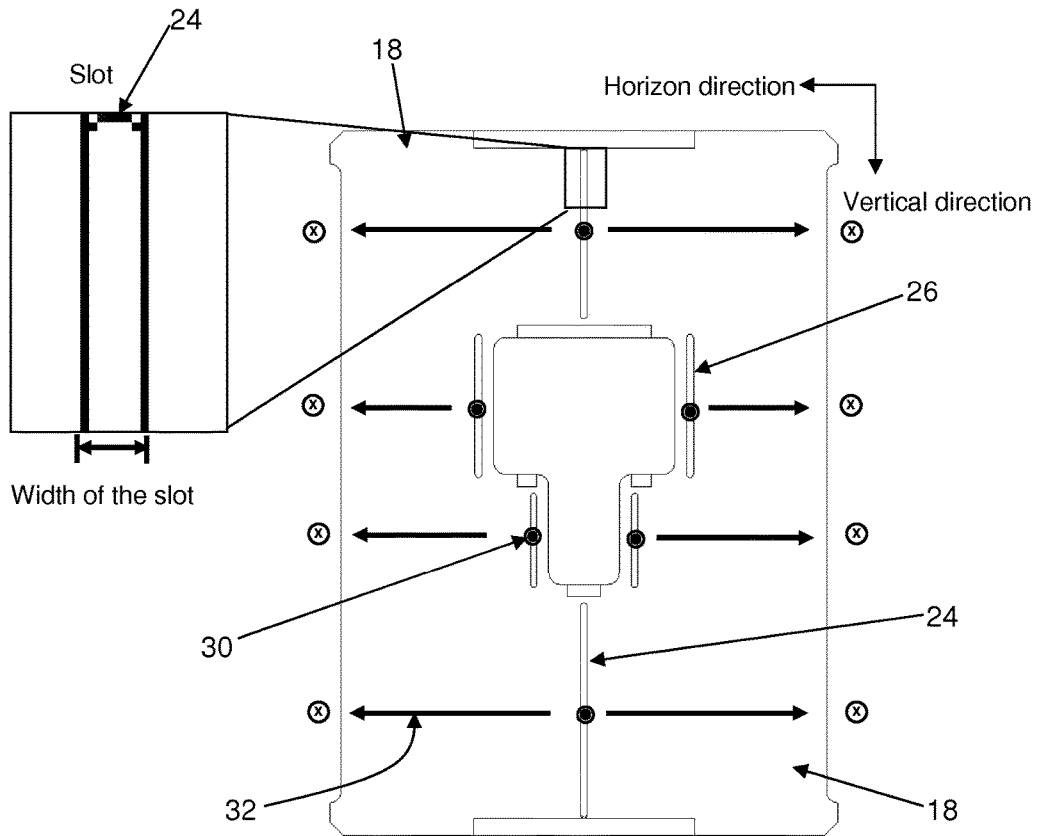
FIG. 4 is a plan view of a front surface of the flow generation plate which is configured to face a heater plate of the bond head.

FIG. 4 is a plan view of the front surface of the flow generation plate 18 which is configured to face the heater plate 14 of the bond head 10. The longitudinal slot 24 and peripheral flow slots 26 are arranged on the flow generator plate 18 to provide wide gas-flow coverage, such as over a surface area corresponding to substantially a whole length of the flow generation plate 18. This ensures that substantially the whole length of the heater plate 14 can be covered by the gas flow from the longitudinal and peripheral flow slots 24, 26.

Due to the presence of the flow slots 24, 26, the cooling gas will flow in direction 30 along the flow generation plate 18 before it reaches the heater plate 14. Since the flow generation plate 18 is located just behind the heater plate 14, the gas that is projected out of the slots 24, 26 are diverted sideways in gas flow directions 32 which spread out over a gap between facing surfaces of the flow generation plate 18 and the heater plate 14, so as to cool the heater plate 14.

FIG. 4 also includes an enlarged view of a part of the longitudinal slot 24. The width of the longitudinal slot 24, as well as that of the peripheral slots 26 should preferably be less than 1 mm. Most preferably, the widths of the respective slots are between 0.1 mm and 0.7 mm. Such a narrow width of the longitudinal and peripheral slots 24, 26 generates a high-speed gas flow to cool the heater plate 14 more efficiently. This is because such a design creates a high-speed gas flow as well as increases the utilization of a surface area that undergoes heat exchange.

Figure 5:
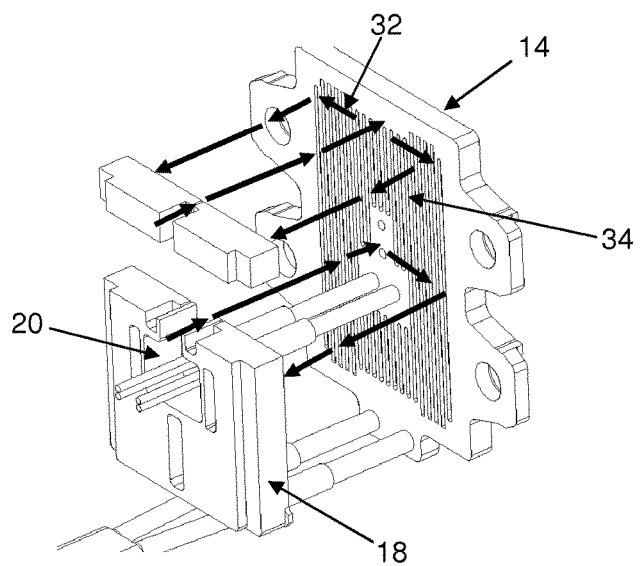
FIG. 5 is an isometric view of the flow generation plate and the heater plate, which illustrates heater fins incorporated on a back surface of the heater plate.

FIG. 5 is an isometric view of the flow generation plate 18 and the heater plate 14, which illustrates heater fins 34 comprising grooved indentations incorporated on a back surface of the heater plate 14. Cooling gas that is projected through the slots 24, 26 onto the heater plate 14 are spread over the heater fins 34, which serve to increase the surface area of the heater plate 14 for the purpose of cooling it. The gas flow directions 32 also illustrate that the cooling gas is introduced substantially centrally through the plurality of flow slots 24, 26 near the central portion of the flow generation plate 18 and spread from a center of the heater plate 14 towards the outer edges of the heater plate 14 to cool the same.

Figure 6:
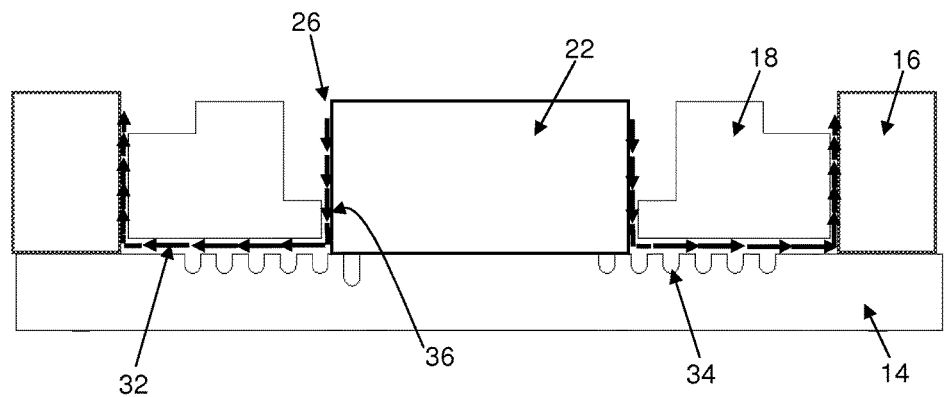
FIG. 6 is a cross-sectional illustration of gas flows generated between the insulation block, flow generation plate and heater plate.

FIG. 6 is a cross-sectional illustration of gas flows generated between the protrusion 22 of the insulation block 16, flow generation plate 18 and heater plate 14. At the position of the protrusion 22, there are inlet openings 36 formed between the flow generation plate 18 and the protrusion 22 near a center of the heater plate 14, and outlet openings between the flow generation plate 18 and side surfaces of the insulation block 16 near opposite edges of the heater plate 14. Cooling gas may be introduced through the inlet openings 36 between the flow generation plate 18 and the protrusion 22 onto the heater plate 14. The gas flow directions 32 over the heater fins 34 of the heater plate 14 are toward the outlet openings between the flow generation plate 18 and side surfaces of the insulation block 16, through an air gap that is created between the flow generation plate 18 and the heater plate 14. The cooling gas projected onto the heater plate 14 escapes through the latter openings.

Figure 7:
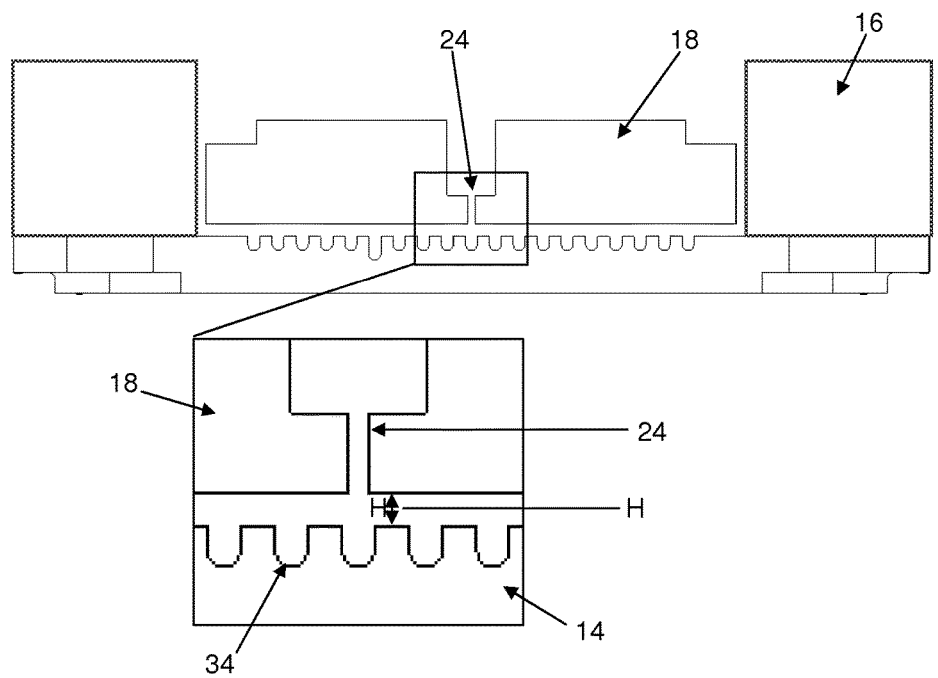
FIG. 7 is a cross-sectional illustration of the flow generation plate adjacent to the heater plate, and includes an enlarged view of an air gap between the flow generation plate and the heater plate.

FIG. 7 is a cross-sectional illustration of the flow generation plate 18 adjacent to the heater plate 14, and includes an enlarged view of an air gap with height H between the flow generation plate 18 and the heater plate 14. This view is taken from a cross-section at a position of the flow generation plate 18 intersecting the longitudinal slot 24. Cooling gas is projected through the longitudinal flow slot 24 onto the heater fins 34 of the heater plate 14, and spread out in the gas flow directions 32 toward openings between the flow generation plate 18 and side surfaces of the insulation block 16 where heated cooling gas escapes.

The enlarged view shows an air gap with height H that is formed between the flow generation plate 18 and the heater plate 14 to allow cooling gas introduced onto the heater fins 34 to spread out from the center of the heater plate 14 in the gas flow directions 32 toward opposite edges of the heater plate 14. The said height H is preferably between 0.1 mm and 1.5 mm, and may be adjusted according to a designer's requirements regarding a desired cooling rate and pressure.

Thus, although the narrow flow slots 24, 26 are designed to certain dimensions in the preferred embodiment as stated above, the effect can also be achieved by controlling the height H of the air gap between the flow generator plate 18 and the heater plate 14.

The flow generation plate 18 may be made from graphite or stainless steel (such as Corrax™), but it may also be made from other suitable materials. Moreover, a total thermal mass of the flow generation plate 18 is preferably less than 50% of a cut-off volume in the insulation block 16 for reducing a thermal mass of the insulation block 16.

It should be appreciated that the cooling system according to the preferred embodiment of the invention as described above separates the design of the cooling apparatus from the insulation block 16, such that the cooling channel is not machined onto the insulator block 16. Instead, a separate flow generation plate 18 is attached to the insulation block 16 to form a specially-designed flow channel.

The separation of the flow generation plate 18 from the insulation block 16 offers greater freedom to select appropriate material for components of a bond head 10 to form an effective cooling gas flow. Therefore, a flow generation plate 18 which has a lower thermal mass than the insulation block 16 becomes possible. Such separation also facilitates machining of flow channels, which serves to increase the dimensional accuracy of the flow slots 24, 26 generating the cooling gas flow. Better dimensional accuracy means that smaller and finer fabrication features become achievable, and a much more delicate cooling channel design become possible.

Accordingly, this enables the generation of the cooling gas flow from narrower slots as compared, for instance, with slots formed on the body of the insulation block 16. The flow channels with narrow slots have demonstrated better cooling rates than wider flow channels used in the prior art. The aforesaid thermal mass reduction, as well as delicate cooling channels generating gas flows from a center to opposite sides of a heater plate 14, have been able to achieve an improved cooling rate of up to 20% as compared to the prior art.

The invention described herein is susceptible to variations, modifications and/or additions other than those specifically described and it is to be understood that the invention includes all such variations, modifications and/or additions which fall within the spirit and scope of the above description.

The invention claimed is:

1. A bond head, comprising:
an insulation block;
a heater plate attached to the insulation block and a collet located on the heater plate for holding a semiconductor device, the heater plate being operative to heat the semiconductor device that is held by the collet; and
a flow generation plate that is detachably mounted between the insulation block and the heater plate which is configured to direct cooling gas from the insulation block onto the heater plate so as to rapidly cool the heater plate;
wherein the flow generation plate is clamped between the insulation block and the heater plate such that a first planar surface of the flow generation plate faces the insulation block and a second planar surface of the flow generation plate that is opposite to the first planar surface faces the heater plate.

2. The bond head as claimed in claim 1, wherein the flow generation plate comprises a plurality of slots near a central portion of the flow generation plate, such that cooling gas is configured to be introduced through the plurality of slots centrally onto the heater plate in directions toward outer edges of the heater plate.

3. The bond head as claimed in claim 2, wherein the slots are machined onto the flow generation plate before mounting the flow generation plate between the insulation block and the heater plate.

4. The bond head as claimed in claim 2, wherein the slots have openings that are wider on a side of the flow generation plate facing the insulation block as compared to another side of the flow generation plate facing the heater plate.

5. The bond head as claimed in claim 4, wherein the flow generation plate includes a gas chamber located adjacent to the slot on the side of the flow generation plate facing the insulation block.

6. The bond head as claimed in claim 2, wherein the plurality of slots comprises at least one longitudinal slot extending centrally along a majority of a length of the flow generation plate facing the heater plate for introducing cooling gas centrally onto the heater plate.

7. The bond head as claimed in claim 2, wherein the cooling gas that is introduced through the slots is diverted in flow directions which spread out over a gap between facing surfaces of the flow generation plate and the heater plate, so as to cool the heater plate.

8. The bond head as claimed in claim 7, wherein the cooling gas is spread out along the gap between the flow generation plate and the heater plate towards openings between the flow generation plate and side surfaces of the insulation block where heated cooling gas escapes.

9. The bond head as claimed in claim 7, wherein a height of the gap formed between the facing surfaces of the flow generation plate and the heater plate is between 0.1 mm and 1.5 mm.

10. The bond head as claimed in claim 2, wherein a width of each slot is less than 1 mm.

11. The bond head as claimed in claim 10, wherein the width of each slot is between 0.1 mm and 0.7 mm.

12. The bond head as claimed in claim 1, further comprising a through-hole located centrally in the flow generation plate for insertion of a protrusion extending from the insulation block.

13. The bond head as claimed in claim 12, further comprising peripheral flow slots in the flow generation plate that extend alongside opposite edges of the through-hole.

14. The bond head as claimed in claim 13, further comprising inlet openings formed between the flow generation plate and the protrusion near a center of the heater plate for introducing cooling gas through the inlet openings onto the heater plate, and outlet openings between the flow generation plate and side surfaces of the insulation block near opposite edges of the heater plate where heated cooling gas escapes.

15. The bond head as claimed in claim 1, further comprising heater fins comprising grooved indentations incorporated on a surface of the heater plate facing the flow generation plate.

16. The bond head as claimed in claim 1, wherein the flow generation plate is made from graphite or stainless steel.

17. The bond head as claimed in claim 1, wherein a total thermal mass of the flow generation plate is less than 50% of a cut-off volume in the insulation block for reducing a thermal mass of the insulation block.

18. A flow generation plate for a bond head comprising an insulation block, a heater plate attached to the insulation block and a collet located on the heater plate for holding a semiconductor device, the heater plate being operative to heat the semiconductor device that is held by the collet, wherein:
the flow generation plate is detachably mountable between the insulation block and the heater plate and is configured to direct cooling gas from the insulation block onto the heater plate so as to rapidly cool the heater plate; and
the flow generation plate is clamped between the insulation block and the heater plate when it is mounted such that a first planar surface of the flow generation plate faces the insulation block and a second planar surface of the flow generation plate that is opposite to the first planar surface faces the heater plate.

* * * * *